United States Patent [19]

Justice et al.

[11] Patent Number: 4,514,440

[45] Date of Patent: Apr. 30, 1985

[54] SPIN-ON DOPANT METHOD

[75] Inventors: Bruce H. Justice, East Aurora; Robert F. Aycock, Clarence, both of N.Y.

[73] Assignee: Allied Corporation, Morris Township, Morris County, N.J.

[21] Appl. No.: 560,473

[22] Filed: Dec. 12, 1983

[51] Int. Cl.³ .................... B05D 5/12; B05D 3/12; H01L 7/44

[52] U.S. Cl. .................... 427/85; 148/188; 427/240

[58] Field of Search .......... 148/188; 427/85, 240

[56] References Cited

U.S. PATENT DOCUMENTS 3,997,351 12/1976 Vergano et al. .......... 427/85 X
4,233,093 11/1980 Chow .................. 148/188 X
4,249,970 2/1981 Briska et al. ............ 148/188
4,348,428 9/1982 Rockley et al. .......... 148/188 X

OTHER PUBLICATIONS

D. Rupprecht and J. Stach, *J. Electrochem. Soc.*, BN Wafers as Dopant for Si Diffusion, pp. 1266–1271, Sep. 1973.

T. R. Facey, J. Stach and R. E. Tressler, *Proc. Electron.*, Components Conf. 30th, pp. 44–48, 1980.

*Solid State Technology*, 1980, vol. 3, No. 7, pp. 69–73.

*Solid State Technology*, 1976, System Characterization of Planar Source Diffusion, pp. 38–43.

Carborundum Co., Technical Bulletin, PDS® Boron Nitride High Temperature Planar Diffusion Sources (BN-1100 and BN-1250).

Carborundum Co., Product Data Bulletin, Low Defect Boron Diffusion Processes Using Hydrogen Injection.

Carborundum Co., Technical Bulletin, PDS® Boron Nitride Low Temperature Planar Diffusion Source (Grade BN-975).

Carborundum Co., Technical Bulletin, Phosphorous N-Type Planar Diffusion Source Grade PH-1000.

*Primary Examiner*—Michael R. Lusignan
*Attorney, Agent, or Firm*—Arthur J. Plantamura; Jay P. Friedenson

[57] ABSTRACT

A single step method for boron dopant diffusion implementing both deposition and drive-in diffusions in one furnace process is provided. By using a spin-on dopant in a diffusion furnace with pyrogenic steam and thermal ramping capabilities, sheet resistivities and penetrations to a precision and accuracy of 4% with one furnace step are achievable. The one step method disclosed circumvents the use of two furnace processes to achieve a typical p-type diffusion which requires a deposition in a furnace set at one temperature followed by a drive in diffusion in a furnace set at a second temperature after deglazing in a hydrofluoric acid. Also attainable by the one step process disclosed are resistivity uniformities better than those with the two furnace processes.

8 Claims, No Drawings

SPIN-ON DOPANT METHOD

TECHNICAL FIELD

This invention relates to spin-on methods of applying dopant materials in semiconductor manufacture and, more particularly, to a method for deposition and drive in diffusion of a boron spin-on dopant in a single furnace process using a standard furnace with pyrogenic oxidation capability.

BACKGROUND OF THE INVENTION

In the usual methods of producing semiconducting p-type boron doped layers in semiconductor manufacturing, ordinarily two separate furnace processes are required.

In the first process a deposition is performed at a lower temperature usually 900° C. to 1150° C. after which a drive in step follows. This step produces a relatively thin doped layer semiconducting p-type silicon, but also is marked by the presence of silicon borides; these also conduct. If heated to higher temperatures, these borides decompose and act as a boron source which produces an uncontrolled impurity distribution in the final alloy (semiconductor). Thus the second step usually requires a chemical oxidation treatment to remove a controlled fraction of the boron that has diffused in the deposition. Moreover, borosilicates on the silicon surface are normally etched off between diffusions in an aqueous acid fluoride solution as part of the process. Thus in the normal mode of producing a p-type boron layer silicon, a controlled amount of boron inclusive of boride and borate formation is deposited and then a controlled portion of this layer is driven to a depth considerably deeper than that of the deposition. The latter diffusion is performed at higher temperature usually of the order of 1000° C. to 1200° C.

This process can be shortened into one process if the source doping species is limited or can be turned off after deposition and suitable control of boron concentration can be exercised during the high temperature drive-in diffusion.

It is apparent that this two furnace type method is time consuming and, because of the careful handling required, is a relatively inefficient and expensive procedure. Accordingly, a need exists for a more expeditious and practical method for circumventing the use of the two furnace process to achieve p-type diffusions in the doping of semiconductor substrates.

SUMMARY OF THE INVENTION

The present invention relates to the method of performing the boron p-type diffusion in one continuous process. The process can be applied where the dopant source is a spin-on dopant, a gaseous (e.g. BBrHd 3, BCl$_3$ or B$_2$H$_6$) dopant, or any dopant source which can be turned off after a suitable deposition period. With a suitable gas handling system and temperature ramping (adjustment) controls on a single furnace, it is demonstrated that the deglazing and drive-in diffusion can be performed all in a continuous sequence in situ in the deposition furnace.

A typical process in accordance with the invention would include:

(1) deposition (after spinning dopant on or from a gaseous source) for 15 to 60 minutes in the furnace at 900° C. to 1150° C. to give an initial sheet resistance of 4 to 200 ohms/square;

(2) isolating the semiconductor from the dopant on the surface at deposition temperature with steam (an atmosphere of burned hydrogen/oxygen is preferred) for 5 to 15 minutes;

(3) thermal ramping to the drive-in temperature in an inert or oxidizing environment (e.g. N$_2$, O$_2$ or burned H$_2$) depending on the deposition resistivity and the desired drive-in resistivity;

(4) oxidizing the excess silicon borides for 5 to 20 minutes at the drive-in temperature with steam (burned hydrogen/oxygen preferred); and (5) driving in the boron in the resulting layer to the desired depth and resistivity in an inert or oxidizing environment.

DESCRIPTION OF THE PREFERRED EMBODIMENTS

By utilizing the single step spin-on dopant and diffusion procedure in accordance with the invention resistivities and penetrations to the precision and accuracy desired are attainable more expeditiously and economically.

By using a spin-on dopant in a diffusion furnace with pyrogenic steam and thermal ramping capabilities, it is demonstrated that it is possible to achieve sheet resistivities and penetrations to a precision and accuracy of 4% with one furnace step.

As is known in the art, various gaseous sources for boron deposition may be employed, e.g. BBr$_3$, BCl$_3$, B$_2$H$_6$ and the like, so long as the dopant source is one which can be stopped after a suitable deposition period. Using a suitable gas handling system equipped with adequate temperature adjusting capability (ramping controls), the desired deglazing and drive-in diffusion can be performed in a continuous sequence in situ in a single deposition furnace.

Although it will be apparent to those skilled in the art that variations can be made in the typical method for carrying out the invention, the following series of steps will serve to describe the essence of the method of the invention.

Deposition of the dopant on the substrate is preferably done by the method known as "spin-on" wherein the liquid dopant is applied to a wafer and the wafer is spun to produce a thin film source. A wafer deposition diffusion period of about 15 minutes to 60 minutes in a furnace at a temperature in the range of about 900° C. to 1150° C. is used to provide an initial sheet resistivity of about 4 to about 200 ohms per square ($\Omega/\square$). Thereafter the semiconductor is isolated from the dopant which has been deposited on the surface at deposition temperatures by using a suitable heated atmosphere, such as steam, and preferably a burned hydrogen atmosphere, for a period of the order of about 5 to 15 minutes.

In the next operation, thermal ramping to the drive-in temperature in an inert or oxidizing environment (e.g. N$_2$, O$_2$ or burned H$_2$) depending on the deposition resistivity and the desired drive-in resistivity is effected. Thereafter the excess silicon borides are utilized for 5 to 20 minutes at the drive-in temperature with steam (with burned hydrogen being preferred). In the final operation the boron is diffused, i.e., driven into the surface of the wafer to the desired depth and resistivity level in an inert or oxidizing environment. The process of the invention allows for adjustment of physical parameters in the semiconductor by those versed in the diffusion art.

Such parameters as sheet resistivity, sheet resistivity precision, regrown oxide thickness, and junction depth, to name a few, can be adjusted by varying the ambient conditions, temperatures, and duration of the abovedescribed steps.

The invention will be further described by the following examples. It should be understood, however, that although these examples may provide in detail certain preferred operating conditions of the invention, they are given primarily for purposes of illustration and the invention in its broader aspects is not limited thereto.

The following general conditions were observed in conducting the runs aimed at achieving a product with resistivities of about 200 $\Omega/\square$ at 2 microns.

Equipment—The diffusion furnace used was a Thermco Model 4304 with a 72 inch (183 cm) element and a 30 inch (76.2 cm) isothermal zone. Gas handling was accomplished with mass flow controllers (Tylan) through Thermco's diode matrix based sequencers (and timers). The actual gas handling system has six gases: (1) $N_2$-5 slpm, (2) $O_2$-3 slpm, (3) $H_2$-5 slpm, (4) $H_2$-150 sccm, (5) $O_2$-250 sccm, and (6) HCl-150 sccm. Thermal ramping was expedited with the Thermco TPC-EH/CP-1 system (Eurotherm Types 125 and 126 rampers and timers). The furnace tube was 135×141 mm with an end cap orifice of 22 mm.

Application of Dopant—The dopants used were 1:1 and 2:1 dilutions of B-150 with toluene (dopant:toluene). The dopant was spun for 10 seconds at 3000 RPM after full coverage. The substrates used were 3 inches in diameter and 1-1-1 Cz 6 to 9 ohm-cm silicon.

Boat and Wafer Configuration—The furnace was loaded with up to 200 wafers in an axial configuration (wafer centers along the furnace tube axis). Four oxidation boats expedited this arrangement. The first and last boats were, when four (200 wafers) boats were diffused, uncoated dummies used to provide thermal inertia, while the middle boats contained the test wafers and coated dummies, all facing downstream. There were 10 test test wafers in each run equally spaced among dummies along the 12 inches (30.5 cm) taken up by the data boats. The train of boats was pushed without delay into the furnace at 800° C. and pulled the same way at the end of the process.

Process Parameters—After inserting the wafer train into the furnace at 800° C., the process typically followed the parameters given in Table 1.

TABLE 1

Single Step Boron Diffusion Process Parameters

| Temperature | Ramp Rate | Time | Gas Flow Rates SLPM | | | Comment |
|---|---|---|---|---|---|---|
| | | | $N_2$ | $H_2$ | $O_2$ | |
| 800 to 950° C. | 15°/Min. | 10 Min. | 3.0 | | | Uncontrolled ramp |
| 950° C. | — | 45 Min. | 3.0 | | | |
| 950° C. | | 15 Min. | | 4.8 | 2.9 | |
| 950 to 1100° C. | 7.4°/Min. | 20 Min. | | 4.8 | 2.9 | Controlled ramp |
| 1100° C. | | 20 Min. | | 4.8 | 2.9 | |
| 1100° C. | | 100 Min. | 1.5 | | 1.5 | |
| 1100 to 800° C. | 4°/Min. | 75 Min. | 3.0 | | | Controlled ramp |

Results—The data in the examples in the sequel show a range of 175 to 225 $\Omega/\square$ with a uniformity (std. dev.) across the waver bordering on 2%. A spreading resistance profile shows a typical junction depth of 1.8 microns. The oxide grown back by the process is about 0.3 micron.

EXAMPLE I

Four diffusions were made using the following furnace conditions: 950° C. for 45 min. in 3.0 lpm $N_2$; 950° C. for 15 min. in 3.5 lpm $H_2$ and 2.8 lpm $O_2$; ramp 950° C. to 1100° C. (7.5°/min.) in 3.5 lpm $H_2$ and 2.8 lpm $O_2$; 1100° C. for 20 min. in 3.5 lpm $H_2$ and 2.0 lpm $O_2$; 1100° C. for 100 min. in 1.5 lpm $N_2$ and 1.5 lpm $O_2$; and ramp to 900 (4°/min.) in 3.0 lpm $N_2$.

Three inch wafers (111, 1–9 $\Omega$ cm) spun at 3000 RPM were placed in an oxidation boat (axial configuration). They were spun in pairs with 7.5% and 10% solids dopant and placed face to face (doping face) between 10 wafers (five on each side) spun with B-150. The results derived therefrom are listed below in Table 2.

TABLE 2

| Dopant Solids Content | Run #1 Rs, $\Omega/\square$ | | Run #2 Rs, $\Omega/\square$ | | Run #3 Rs, $\Omega/\square$ | | Run #4 Rs, $\Omega/\square$ | |
|---|---|---|---|---|---|---|---|---|
| 7.5% (1:1 of B-150) | 208 ± 3, | 206 ± 3 | 217 ± 3, | 214 ± 4 | 216 ± 1, | 209 ± 3 | 205 ± 2, | 203 ± 4 |
| 10% (2:1 of B-150) | 212 ± 3, | 210 ± 2 | 225 ± 4, | 225 ± 3 | 225 ± 2, | 221 ± 3 | 217 ± 4, | 214 ± 4 |

| | Ave. Rs, $\Omega/\square$ - 7.5% Solids | Ave. Rs, $\Omega/\square$ - 10% Solids |
|---|---|---|
| Run #1 | 209 ± 3 | 211 ± 3 |
| Run #2 | 215 ± 4 | 225 ± 3 |
| Run #3 | 213 ± 4 | 223 ± 3 |
| Run #4 | 204 ± 3 | 215 ± 4 |

The junction depth was found to be 1.5 to 1.7 microns.

EXAMPLE II

The process outlined in Example I was run. The following modifications were made. The wafers were inserted at 800° C. and ramped to 950° C. without control—about 9 minutes. The wafers were ramped down to 800° C. under control after the drive-in stage. The deposition under nitrogen was 40 minutes.

Three boats (7 inch boat) with 150-3" wafers were spun with dopant. Five outboard thermallizing wafers were used. In board ever inch of boat contained a 10% and 7.5% doped wafer to be measured for resistivity although the rest had dopant spun on. The results of this diffusion are tabulated in Table 3 as a function of the distance from the leading edge of the boat at the gas end of the furnace.

TABLE 3

| Position (distance from gas end in inches) | Rs, Ω/□ 7.5% Solids | Rs, Ω/□ 10% Solids |
|---|---|---|
| 1" (2.54 cm) | 194 ± 5 | 206 ± 7 |
| 3" (7.62 cm) | 200 ± 5 | 207 ± 6 |
| 5" (12.70 cm) | 203 ± 6 | 215 ± 4 |
| 7" (17.78 cm) | 215 ± 7 | 223 ± 6 |
| 9" (22.86 cm) | 218 ± 5 | 224 ± 4 |
| 11" (27.94 cm) | 220 ± 4 | 229 ± 5 |
| 13" (33.02 cm) | 225 ± 7 | 234 ± 6 |
| 15" (38.10 cm) | 218 ± 6 | 232 ± 7 |
| 17" (43.18 cm) | 221 ± 9 | 228 ± 16 |
| 19" (48.76 cm) | 213 ± 9 | 230 ± 10 |
|  | Ave = 212 ± 10 | 223 ± 10 |

EXAMPLE III

The same diffusion conditions as described in Example II were run except the deposition duration at 950° C. was 45 minutes.

The diffusion configuration was two 7" oxidation boats with 100 wafers. The first and last five wafers were coated but used as thermal dummies. Thereafter a wafer each with 10% and 7.5% boron dopant was spun to be measured and placed every inch along the remaining boat areas. Spun (with dopant) dummies were placed between the data wafers. All wafers faced downstream.

Three diffusions were run and are tabulated in Table 4 below. The data for each diffusion on a particular dopant are tabulated in adjacent columns for comparative purposes.

TABLE 4

| Position in Zones from gas end boat front | Rs, Ω/□ Dopant 7.5% Solids | | | Rs, Ω/□ Dopant 10.0% Solids | | |
|---|---|---|---|---|---|---|
|  | Run #1 | Run #2 | Run #3 | Run #1 | Run #2 | Run #3 |
| 2" (5.18 cm) | 182 ± 4 | 175 ± 6 | 176 ± 3 | 189 ± 4 | 183 ± 5 | 185 ± 4 |
| 3" (7.62 cm) | 177 ± 6 | 180 ± 4 | 176 ± 3 | 191 ± 2 | 192 ± 4 | 187 ± 3 |
| 4" (10.16 cm) | 185 ± 4 | 184 ± 5 | 180 ± 4 | 198 ± 3 | 196 ± 5 | 191 ± 4 |
| 5" (12.70 cm) | 188 ± 5 | 188 ± 4 | 182 ± 4 | 198 ± 4 | 199 ± 6 | 191 ± 3 |
| 6" (13.24 cm) | 191 ± 3 | 191 ± 5 | 187 ± 4 | 203 ± 2 | 202 ± 5 | 195 ± 3 |
| 9" (22.86 cm) | 193 ± 4 | 197 ± 5 | 189 ± 4 | 205 ± 2 | 210 ± 5 | 196 ± 4 |
| 10" (25.40 cm) | 194 ± 6 | 195 ± 5 | 192 ± 5 | 205 ± 3 | 206 ± 5 | 200 ± 3 |
| 11" (27.94 cm) | 194 ± 8 | 193 ± 4 | 192 ± 4 | 210 ± 8 | 199 ± 10 | 200 ± 3 |
| 12" (30.48 cm) | 190 ± 6 | 195 ± 8 | 193 ± 3 | 200 ± 8 | 210 ± 8 | 203 ± 4 |
| 13" (33.07 cm) | 196 ± 7 | 198 ± 7 | 195 ± 2 | 213 ± 10 | 212 ± 9 | 207 ± 3 |
| Ave. | 184 ± 6 | 190 ± 8 | 186 ± 7 | 201 ± 8 | 201 ± 9 | 196 ± 7 |

EXAMPLE IV

The diffusion described in Example III was repeated four times with the following modifications:
Diffusion #1—Exactly as Example III.
Diffusion #2—50 wafers (uncoated) on either end of diffusion load.
Diffusion #3—100 wafers ballast as #2, dropped back furnace zone 20° C. and raised front 5° C. during H2O2 cycles.
Diffusion #4—Ran normal gas zones during H2/O2 cycles. 100 wafers ballast as in #2.
The results are collected in Tables 5 and 6.

TABLE 5

| "inches" Position on Diffusion Boat | Rs, Ω/□ - 7.5% Solid Dopant | | | |
|---|---|---|---|---|
|  | Diffusion #1 | Diffusion #2 | Diffusion #3 | Diffusion #4 |
| 2" (5.08 cm) | 175 ± 6 | 176 ± 3 | 175 ± 3 | 194 ± 6 |
| 3" (7.62 cm) | 180 ± 4 | 176 ± 3 | 179 ± 1 | 195 ± 2 |
| 4" (10.16 cm) | 184 ± 5 | 180 ± 4 | 180 ± 2 | 196 ± 2 |
| 5" (12.70 cm) | 188 ± 4 | 182 ± 4 | 182 ± 2 | 197 ± 1 |
| 6" (15.24 cm) | 191 ± 5 | 187 ± 4 | 183 ± 2 | 197 ± 3 |
| 9" (22.86 cm) | 197 ± 5 | 189 ± 4 | 187 ± 4 | 201 ± 3 |
| 10" (25.40 cm) | 195 ± 5 | 192 ± 5 | 190 ± 2 | 202 ± 2 |
| 11" (27.94 cm) | 195 ± 4 | 192 ± 4 | 192 ± 2 | 203 ± 2 |
| 12" (30.48 cm) | 195 ± 8 | 193 ± 3 | 192 ± 3 | 202 ± 2 |
| 13" (33.02 cm) | 198 ± 7 | 195 ± 2 | 197 ± 4 | 203 ± 2 |
| Ave. | 190 ± 8 | 186 ± 7 | 186 ± 7 | 199 ± 3 |

TABLE 6

| "inches" Position on Diffusion Boat | Rs, Ω/□ Solid Dopant | | | |
|---|---|---|---|---|
|  | Diffusion #1 | Diffusion #2 | Diffusion #3 | Diffusion #4 |
| 2" (5.08 cm) | 183 ± 5 | 185 ± 4 | 186 ± 3 | 202 ± 3 |
| 3" (7.62 cm) | 192 ± 4 | 187 ± 3 | 186 ± 2 | 203 ± 3 |
| 4" (10.6 cm) | 196 ± 5 | 191 ± 4 | 189 ± 2 | 208 ± 2 |
| 5" (17.70 cm) | 199 ± 6 | 191 ± 3 | 191 ± 2 | 205 ± 1 |
| 6" (15.24 cm) | 202 ± 5 | 195 ± 3 | 199 ± 3 | 206 ± 1 |
| 9" (22.86 cm) | 210 ± 5 | 196 ± 4 | 197 ± 4 | 208 ± 2 |
| 10" (25.40 cm) | 206 ± 5 | 200 ± 3 | 197 ± 3 | 211 ± 2 |
| 11" (27.94 cm) | 199 ± 10 | 200 ± 3 | 197 ± 4 | 212 ± 1 |
| 12" (30.40 cm) | 210 ± 8 | 203 ± 4 | 197 ± 3 | 209 ± 2 |
| 13" (33.02 cm) | 212 ± 9 | 207 ± 3 | 204 ± 2 | 212 ± 2 |
| Ave. | 201 ± 9 | 196 ± 7 | 194 ± 6 | 207 ± 4 |

EXAMPLE V

The diffusion#4 of Example IV showed improvement especially the end wafers by adding 50 wafers ballast at the ends of measurement boats by virtue of smoothing out the flat zone during the thermal ramp cycles. Running with a nominal flat zone for gases (non-reacting), even though H2 and O2 was passing through the tube also improves the overall wafer to wafer consistency as suggested by diffusion #4 of Example IV. Four more diffusions were run as Example IV diffusion #4 with the front furnace zone raised 10° C. during all cycles with two lots of B-150. The results presented in Tables 7 and 8 show further improvement in consistency.

TABLE 7

| Position in inches front of boat | Rs, Ω/□ 7.5% Solids Diffusion # | | | |
|---|---|---|---|---|
|  | 1 (lot 2) | 2 (lot 2) | 3 (lot 5) | 4 (lot 5) |
| 2" (5.08 cm) | 194 ± 8 | 194 ± 8 | 212 ± 3 | 205 ± 2 |

TABLE 7-continued

| Position in inches front of boat | Rs, Ω/□ 7.5% Solids Diffusion # | | | |
|---|---|---|---|---|
| | 1 (lot 2) | 2 (lot 2) | 3 (lot 5) | 4 (lot 5) |
| 3" (7.62 cm) | 196 ± 6 | 193 ± 5 | 207 ± 2 | 201 ± 2 |
| 4" (10.16 cm) | 196 ± 5 | 193 ± 6 | 204 ± 4 | 203 ± 3 |
| 5" (12.70 cm) | 197 ± 6 | 194 ± 6 | 206 ± 3 | 204 ± 2 |
| 6" (15.24 cm) | 199 ± 5 | 196 ± 7 | 206 ± 2 | 205 ± 4 |
| 9" (22.86 cm) | 197 ± 5 | 198 ± 4 | 206 ± 3 | 204 ± 2 |
| 10" (2540 cm) | 196 ± 5 | 196 ± 6 | 204 ± 3 | 201 ± 3 |
| 11" (27.94 cm) | 196 ± 5 | 196 ± 4 | 201 ± 5 | 200 ± 3 |
| 12" (30.48 cm) | 195 ± 4 | 194 ± 5 | 198 ± 2 | 199 ± 3 |
| 13" (33.02 cm) | 195 ± 5 | 191 ± 3 | 199 ± 3 | 197 ± 4 |
| Ave. | 196 ± 1 | 195 ± 2 | 204 ± 4 | 202 ± 3 |

TABLE 8

| Position in inches front of boat | Rs, Ω/□ 10% Solids Diffusion # | | | |
|---|---|---|---|---|
| | 1 (lot 2) | 2 (lot 2) | 3 (lot 5) | 4 (lot 5) |
| 2" (5.08 cm) | 204 ± 6 | 201 ± 10 | 217 ± 3 | 212 ± 5 |
| 3" (7.62 cm) | 204 ± 3 | 204 ± 6 | 214 ± 1 | 211 ± 2 |
| 4" (10.16 cm) | 205 ± 2 | 205 ± 5 | 213 ± 3 | 212 ± 2 |
| 5" (12.7 cm) | 207 ± 4 | 206 ± 6 | 213 ± 2 | 212 ± 2 |
| 6" (15.24 cm) | 206 ± 4 | 207 ± 5 | 215 ± 3 | 214 ± 2 |
| 9" (22.86 cm) | 207 ± 3 | 208 ± 4 | 213 ± 3 | 208 ± 2 |
| 10" (25.40 cm) | 205 ± 3 | 205 ± 4 | 211 ± 2 | 210 ± 1 |
| 11" (27.94 cm) | 202 ± 2 | 205 ± 5 | 210 ± 2 | 206 ± 1 |
| 12" (30.48 cm) | 201 ± 5 | 203 ± 4 | 210 ± 4 | 204 ± 2 |
| 13" (33.02 cm) | 203 ± 4 | 200 ± 4 | 211 ± 4 | 207 ± 3 |
| Ave. | 204 ± 2 | 204 ± 2 | 213 ± 2 | 210 ± 3 |

It will be apparent that a control thermocouple inside the diffusion tube or chamber may be employed in lieu of a typical outside-the-wall contact type thermocouple. This would reflect a material improvement in the results shown in Tables 7 and 8.

The process of the present invention may be applied in the manufacture of a variety of devices for the semiconductor fabrication industry, e.g., bipolar and MOS integrated circuits, discrete devices, photovoltaic (solar) cells, and the like. Of particular applicability is the spin-on dopant technique in the manufacture of bipolar integrated circuits for base and isolation diffusions.

It will be apparent that variations in the details presented herein may be made by those skilled in the art. Therefore, the invention is not to be limited except as set forth in the appended claims.

What is claimed is:

1. A single furnace method for boron dopant deposition and diffusion of a p-type semiconductor substrates comprising:
    (a) applying a dopant layer to said semiconductor substrate from a gaseous dopant source until an initial resistivity in the range of about 4 to about 200 ohms per square is attained;
    (b) producing a conducting interfacial layer between said semiconductor substrate and said dopant layer by maintaining a temperature of at least about 900° C.;
    (c) removing said dopant source by maintaining a steam atmosphere of at least about 900° C.;
    (d) thermal ramping said treated semiconductor substrate to a drive in temperature for the doping in an atmosphere selected from inert, oxidizing or steam;
    (e) oxidizing excess silicon boride by subjecting said treated semiconductor substrate for about 5 to 20 minutes in a steam atmosphere at a temperature of the order of 1050° C. to 1250° C.; and
    (f) driving the boron present in said interfacial layer to the desired depth and resistivity level in an inert or oxidizing atmosphere.

2. The method of claim 1 wherein step (c) is conducted in an atmosphere of burned hydrogen.

3. The method of claim 1 wherein step (e) is conducted in an atmosphere of burned hydrogen.

4. The method of claim 1 wherein the dopant applied in step (a) is effected by a spin-on process.

5. The method of claim 1 wherein the temperature employed in step (b) is between 900° C. and 1150° C.

6. The method of claim 1 wherein the atmosphere employed in step (c) is burned hydrogen.

7. The method of claim 1 wherein the temperature in step (c) is 900° C. to 1150° C.

8. The method of claim 1 wherein the atmosphere employed in step (e) is burned hydrogen.

* * * * *